(12) United States Patent
Yoo et al.

(10) Patent No.: US 11,476,241 B2
(45) Date of Patent: Oct. 18, 2022

(54) INTERPOSER, MICROELECTRONIC DEVICE ASSEMBLY INCLUDING SAME AND METHODS OF FABRICATION

(71) Applicant: Micron Technology, Inc., Boise, ID (US)

(72) Inventors: Chan H. Yoo, Boise, ID (US); Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/805,341

(22) Filed: Feb. 28, 2020

(65) Prior Publication Data

US 2020/0303363 A1  Sep. 24, 2020

Related U.S. Application Data

(60) Provisional application No. 62/820,548, filed on Mar. 19, 2019.

(51) Int. Cl.
| | | |
|---|---|---|
| *H01L 25/18* | (2006.01) | |
| *H01L 23/00* | (2006.01) | |
| *H01L 21/78* | (2006.01) | |
| *H01L 25/00* | (2006.01) | |

(52) U.S. Cl.
CPC .............. *H01L 25/18* (2013.01); *H01L 21/78* (2013.01); *H01L 24/05* (2013.01); *H01L 24/06* (2013.01); *H01L 25/50* (2013.01); *H01L 2224/02331* (2013.01); *H01L 2224/02372* (2013.01); *H01L 2224/02381* (2013.01); *H01L 2224/05569* (2013.01); *H01L 2224/06182* (2013.01); *H01L 2924/1437* (2013.01)

(58) Field of Classification Search
None
See application file for complete search history.

(56) References Cited

U.S. PATENT DOCUMENTS

| | | | |
|---|---|---|---|
| 8,203,213 | B2 | 6/2012 | Lee et al. |
| 8,703,599 | B2 | 4/2014 | Fee |
| 9,153,508 | B2 | 10/2015 | Partsch |
| 9,607,967 | B1 | 3/2017 | Shih |
| 9,679,615 | B2 | 6/2017 | Jeddeloh et al. |
| 2013/0141442 | A1 | 6/2013 | Brothers et al. |
| 2013/0252378 | A1 | 9/2013 | Jeng et al. |
| 2014/0126274 | A1 | 5/2014 | Lee et al. |
| 2014/0181427 | A1 | 6/2014 | Jayasena et al. |
| 2015/0046612 | A1 | 2/2015 | Gupta |

(Continued)

OTHER PUBLICATIONS

International Search Report for International Application No. PCT/US20/22050, dated Jul. 22, 2020, 4 pages.

(Continued)

*Primary Examiner* — Long Pham
(74) *Attorney, Agent, or Firm* — TraskBritt

(57) ABSTRACT

An interposer comprises a semiconductor material and includes cache memory under a location on the interposer for a host device. Memory interface circuitry may also be located under one or more locations on the interposer for memory devices. Microelectronic device assemblies incorporating such an interposer and comprising a host device and multiple memory devices are also disclosed, as are methods of fabricating such microelectronic device assemblies.

24 Claims, 12 Drawing Sheets

(56) References Cited

U.S. PATENT DOCUMENTS

| | | | |
|---|---|---|---|
| 2015/0286529 A1 | 10/2015 | Lunde | |
| 2015/0357306 A1* | 12/2015 | Thottethodi | ............ H04L 45/00 257/621 |
| 2016/0041856 A1 | 2/2016 | Sankaralingam et al. | |
| 2017/0077076 A1 | 3/2017 | Wang et al. | |
| 2020/0111764 A1* | 4/2020 | Kim | .................. H01L 23/49513 |

OTHER PUBLICATIONS

International Written Opinion for International Application No. PCT/US20/22050, dated Jul. 22, 2020, 9 pages.

Li et al., Redistribution Layer (RDL) Process Development and Improvement for 3D, 2011 13th Electronics Packaging Technology Conference, https://www.researchgate.net/publication/254027844, (Dec. 2011), 5 pages.

Yield Engineering Systems, Inc., Author Unknown, "RDL-Bond Pad Redistribution Layers," Yield Engineering Systems, Inc., (Date Unknown), 4 pages, www.yieldengineering.com/portals/0/yes-rdl-explanation.pdf.

Yoo, Chan H., Graphics Processing Unit and High Bandwidth Memory Integration Using Integrated Interface and Silicon Interposer, U.S. Appl. No. 16/180,538, filed Nov. 8, 2018.

Yoo, Chan H., Graphics Processing Unit and High Bandwidth Memory Integration Using Integrated Interface and Silicon Interposer, U.S. Appl. No. 16/180,361, filed Nov. 5, 2018.

* cited by examiner

INTERPOSER, MICROELECTRONIC DEVICE ASSEMBLY INCLUDING SAME AND METHODS OF FABRICATION

CROSS-REFERENCE TO RELATED APPLICATION

This application claims the benefit under 35 U.S.C. § 119(e) of U.S. Provisional Patent Application Ser. No. 62/820,548, filed Mar. 19, 2019, the disclosure of which is hereby incorporated herein in its entirety by this reference.

TECHNICAL FIELD

Embodiments disclosed herein relate to interposers incorporating multiple functions and to microelectronic device assemblies including such interposers, as well as to methods of fabrication of such assemblies. More particularly, embodiments disclosed herein relate to interposers comprising a semiconductor material and incorporating active circuitry and interface functions for mutual high bandwidth communication between microelectronic devices operably coupled to the interposer, to assemblies of such microelectronic devices and interposers, and to method of fabrication of such assemblies.

BACKGROUND

Many forms of microelectronic devices such as IC (integrated circuit) assemblies include multiple semiconductor die (also referred to herein as "die") or assemblies of such die physically and electrically connected to one another through an interposer. In some cases, such assembly on the interposer may be termed a "Multi-Chip Package" or "MCP." In some embodiments, the interposer may include a redistribution structure (sometimes termed in the art a "redistribution layer" or "RDL," as discussed further below) configured to establish interconnections between two or more of the multiple die within the assembly, and also to facilitate electrical and mechanical attachment to other devices (for example, a printed circuit board, such as a motherboard, or other higher-level packaging).

Such an RDL may include one or more dielectric layers, each dielectric layer supporting a level of conductive material defining conductive traces and vias extending through the respective dielectric layer to connect, directly or indirectly, with respective contacts on one or more semiconductor die and/or with vias in other layers of the RDL, to redistribute the die contacts to other locations on or within the interposer.

Interposers may be constructed with a core structure including either a non-organic material, such as a semiconductor material, such as silicon (generally termed a "silicon interposer"), or any one (or more) organic materials (generally termed an "organic interposer"). The term "semiconductor interposer" is used herein to identify an interposer comprising, (e.g., having a core formed of) a semiconductor material, which may be either an elemental material (such as e.g., silicon, germanium selenium, etc., as known to persons skilled in the art), or a compound semiconductor material (such as, e.g., gallium arsenide, indium gallium arsenide, also as known to persons skilled in the art). The term "non-organic interposer" is used to identify a core formed of a non-organic material which may be, for example, a semiconductor material, a glass material and/or a ceramic material. For purposes of providing examples herein, the embodiments of disclosed semiconductor interposers will be described in the form of silicon interposers.

Under conventional processing, organic interposers tend to be more resilient, and therefore more resistant to cracking or other damage resulting from physical or thermal stresses. That resistance to physical or thermal stresses is somewhat offset, however, by organic interposers typically having a significantly different coefficient of thermal expansion ("CTE") from the CTE of the semiconductor die or die assemblies attached to the interposer, thus being susceptible to generating physical stress at the die attachment. In addition, commercially viable technology for forming organic interposers experiences difficulty in providing line spacings of less than about 10/10 μLS. This current practical limitation leaves a significant dimensional gap relative to feature spacing achievable in conventional silicon processing employed in fabricating state of the art semiconductor die. As a result, current commercially viable processes for forming organic interposers cannot match the minimum contact spacing of semiconductor die that would desirably be attached to the interposer, imposing an undesirable restriction in terms of real estate required for microelectronic device assemblies and requiring undesirably long signal paths.

Further, interposer performance characteristics are becoming of increasing importance for implementation of some high bandwidth applications. One example of a microelectronic assembly disclosed herein includes high bandwidth communications between one or more high bandwidth memory (HBM) devices and a processor. While each memory device may be an individual semiconductor die, it is becoming increasingly common for each memory device to comprise a vertical stack of multiple (e.g., four, eight, twelve, sixteen) memory die interconnected by through silicon vias (TSVs) and inter-die conductive elements, such as copper pillars, operably coupled to the TSVs. In some instances, the stack further includes an operably coupled logic die, which may also be characterized as a controller or interface die. In order to obtain full performance benefit of such multi-die memory devices, an associated processor must be able to access multiple portions of the interconnected memory die in parallel through high-speed parallel communication channels for data, command, and control signals between the processor and the multi-die memory device.

To meet design criteria for such high-speed parallel communications, including without limitation minimization of conductive trace resistance and inter-trace capacitance, interposers are projected to require tighter line spacing ("L/S"), of less than 5/5 μLS, and preferably on the order of 2/2 μLS or smaller. Semiconductor interposers, for example silicon interposers, may be configured to provide such L/S capability since they may be fabricated employing conventional semiconductor die fabrication methods.

While use of semiconductor material-based interposers addresses the above issues, it is conventional as noted above, in implementation of HBM devices to employ a discrete interface die between the stack of memory die of each HBM device and an interposer. Such an approach increases fabrication and assembly costs, lengthens signal paths, and increases height of the HBM device assembly.

In addition to the abovementioned considerations for desirability of implementing interposers using semiconductor (e.g., silicon) materials, utilization of semiconductor materials may also facilitate reduction in cost and size of certain processor categories, for example graphic processing units (GPUs). It has been proposed that GPU designs monolithically integrate cache memory in the form of static random access memory (SRAM). Unfortunately, such an approach would suffer from a requirement of incorporating TSVs in the GPU, but fabrication of the SRAM cache memory requires a significantly different process sequence than is employed in GPU fabrication. In addition, SRAM may consume an undesirable amount of real estate in the GPU due to its memory component structure. Other processors such as central processing units (CPUs), controllers and so-called System on a Chip as well as other host devices may also suffer from a somewhat awkward integration of cache memory circuitry with processor circuitry fabrication techniques.

FIGS. 3A and 3B depict one example of a proposed microelectronic device assembly 300 comprising a host device 302, for example a GPU, and multiple memory devices 304A-304D, for example high bandwidth memory devices, all mounted to an interposer 306 comprising a semiconductor material (e.g., silicon), which may be characterized as a "core." interposer 306 is, in turn, mounted and operably coupled to a laminate (e.g., organic) substrate 308 for connecting microelectronic device assembly 300 to higher-level packaging by, for example discrete conductive elements 310 in the form of balls, bumps or studs of a metal material. As shown in FIG. 3A, GPU has integrated SRAM cache memory 312, which as noted above presents fabrication problems and necessitates the use of TSVs. As shown in FIG. 3B, microelectronic device assembly 300 locates each memory device 304 over and operably coupled to an interface die 314, each interface die 314 being operably coupled to circuitry carried by interposer 306, by which circuitry memory devices 304A-304D communicate with host device 302. TSVs (not shown) extending through interposer 306 in turn communicate with laminate substrate 308, which may comprise multiple levels of circuitry separated by dielectric material, and which circuitry is operably coupled to discrete conductive elements 310 for connection to external circuitry.

Embodiments of the disclosure encompass interposer structures that may be configured, in some implementations, for effectively providing such high bandwidth communication while reducing fabrication and assembly costs and reducing component and assembly size. Microelectronic device assemblies incorporating such interposer structures and methods for fabricating such assemblies may offer advantages in terms of cost reduction and enhanced performance.

DETAILED DESCRIPTION

Figure 1A:
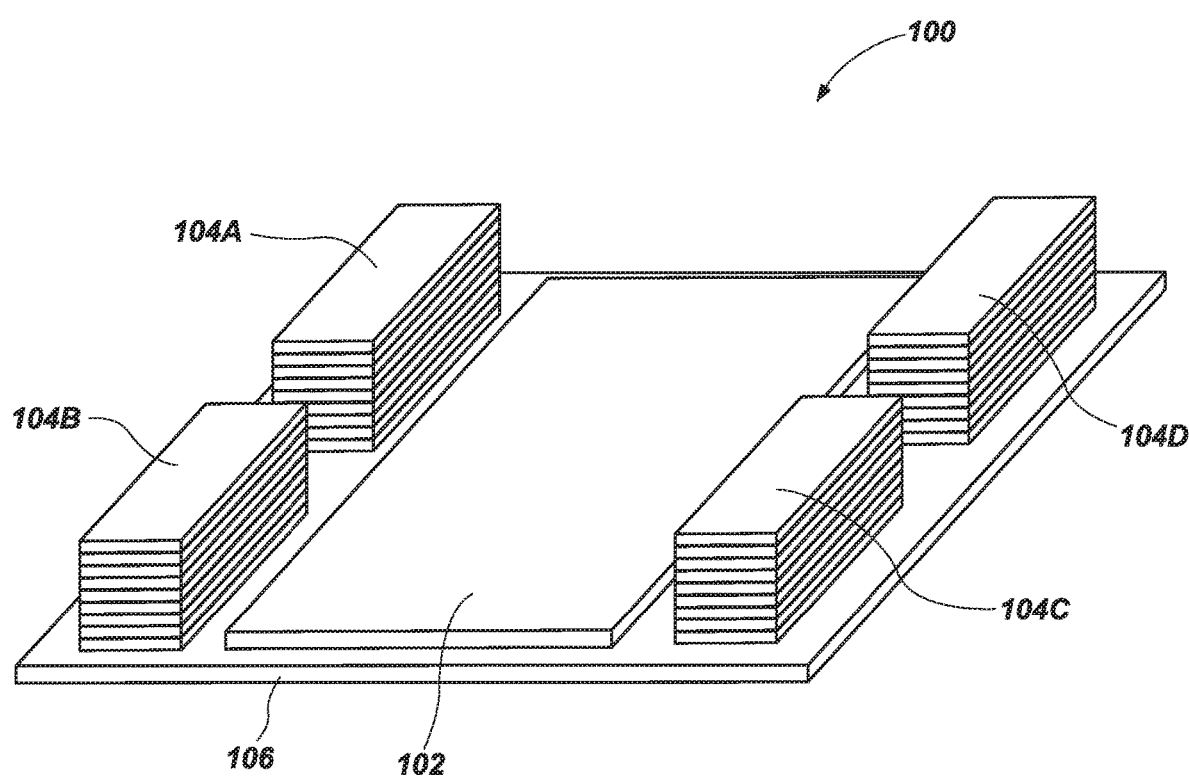
FIG. 1A is a schematic perspective view of a microelectronic assembly including a host device in the form of a processor, and multiple memory devices mounted to an interposer comprising a semiconductor material, according to an embodiment of the disclosure.

Semiconductor (e.g., silicon) interposer structures are disclosed, as well as microelectronic device assemblies including such interposer structures, and methods of fabricating such assemblies.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing an HBM device, a silicon interposer structure, a GPU or other processor, or a microelectronic device assembly including HBM devices, a GPU or other processor and a silicon interposer structure. Only those process acts and structures necessary to understand the embodiments of the disclosure are described in detail below. Additional acts to form a complete HBM device, silicon interposer structure, GPU or other processor, or a microelectronic device assembly including the foregoing may be performed by conventional fabrication processes known to those of ordinary skill in the art in the semiconductor and electronics industry.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As described in more detail below, the specification describes various embodiments of a semiconductor interposer structure. Embodiments include various configurations of interposers including a semiconductor core, such as a silicon core and, optionally, redistribution structures on one or more sides of the semiconductor core. In embodiments, the redistribution structures include multiple individual redistribution layers. The multiple individual redistribution layers may be implemented, in some embodiments, to provide high bandwidth communication capability between microelectronic devices connected through the interposer.

Additionally, the specification describes incorporation of circuit elements, including active circuit elements that may be formed in the interposer. In some embodiments, the active circuit elements will be formed at least in part in the semiconductor core. In some examples, circuit elements may have one or more bodies formed within the semiconductor core and one or more bodies formed in material structures formed over the semiconductor core.

Referring now to the drawings in more detail, and particularly to FIGS. 1A-1E, FIG. 1A depicts a simplified representation of an embodiment of a microelectronic device assembly 100 including a processor 102 and multiple memory devices 104A, 104B, 104C, 104D, connected to a body of interposer 106 comprising semiconductor material (e.g., silicon) in accordance with one or more of the configurations described herein.

As will be apparent to persons skilled in the art, processor 102 may be any of multiple configurations of a processor (e.g., a central processing unit (CPU), a graphics processing unit (GPU), a controller), or a system on a chip (SoC) or some other form of host device. Memory devices 104A, 104B, 104C, 104D may be of the same or different forms; and any of the memory devices may be either a single die or a stack of interconnected memory die, as discussed in more detail in reference to FIG. 1E. The representation of FIG. 1A depicts each memory device 104A, 104B, 104C, 104D as a stack of multiple memory die 108. In some embodiments, the memory devices 104A-104D coupled to interposer 106 may all be of comparable heights. Non-limiting examples of existing memory devices 104A-104D include JEDEC-standard HBM memory devices and Hybrid Memory Cube (HMC) memory devices, both HBM and HMC assemblies comprising multiple, vertically stacked DRAM die.

The processor 102 may exchange information with one or more of memory devices 104A, 104B, 104C, 104D using signals communicated over signal paths formed at least in part within interposer 106. Such signal paths include a path that a message or transmission may take in communicating from a transmitting component to a receiving component. In some cases, a signal path may be a conductor coupled with at least two components, where the conductor allows electrons to flow between the at least two components. In some cases, the signal path may be formed at least in part in a wireless medium as in the case for wireless communications (e.g., radio frequency (RF) or optical). In some examples, interposer 106 will be coupled to an external structure, such as a package substrate, a motherboard, etc., to form part of a larger system as discussed herein in reference to FIG. 8.

In some applications, microelectronic device assembly 100 may benefit from a high-speed connection between the processor 102 and one or more of memory devices 104A, 104B, 104C, 104D. As a result, in some examples, one or more of memory devices 104A, 104B, 104C, 104D will support applications, processes, or processors that have multiple terabytes per second (TB/s) bandwidth needs. Such applications may include a serializer/deserializer ("SerDes") between the memory and a processor or other logic devices requiring high bandwidth. Satisfying such a bandwidth constraint within an acceptable energy budget may pose challenges in certain contexts.

The memory devices 104A, 104B, 104C, 104D and interposer 106 may be configured such that the signal path between memory cells in the memory devices 104A, 104B, 104C, 104D and the processor 102 are as short as the material properties, operating environment, component layout, and application allow. For example, the memory devices 104A, 104B, 104C, 104D may be bufferless memory devices with a point-to-point connection between the host device and the memory array. In other examples, the data channels coupling a memory device 104A, 104B, 104C, 104D with the processor 102 may comprise a point-to-many configuration, with one pin of the processor 102 coupled with corresponding pins of at least two memory arrays (which may be located in the same or different memory die 108, and/or memory devices 104A-104D).

Figure 5:
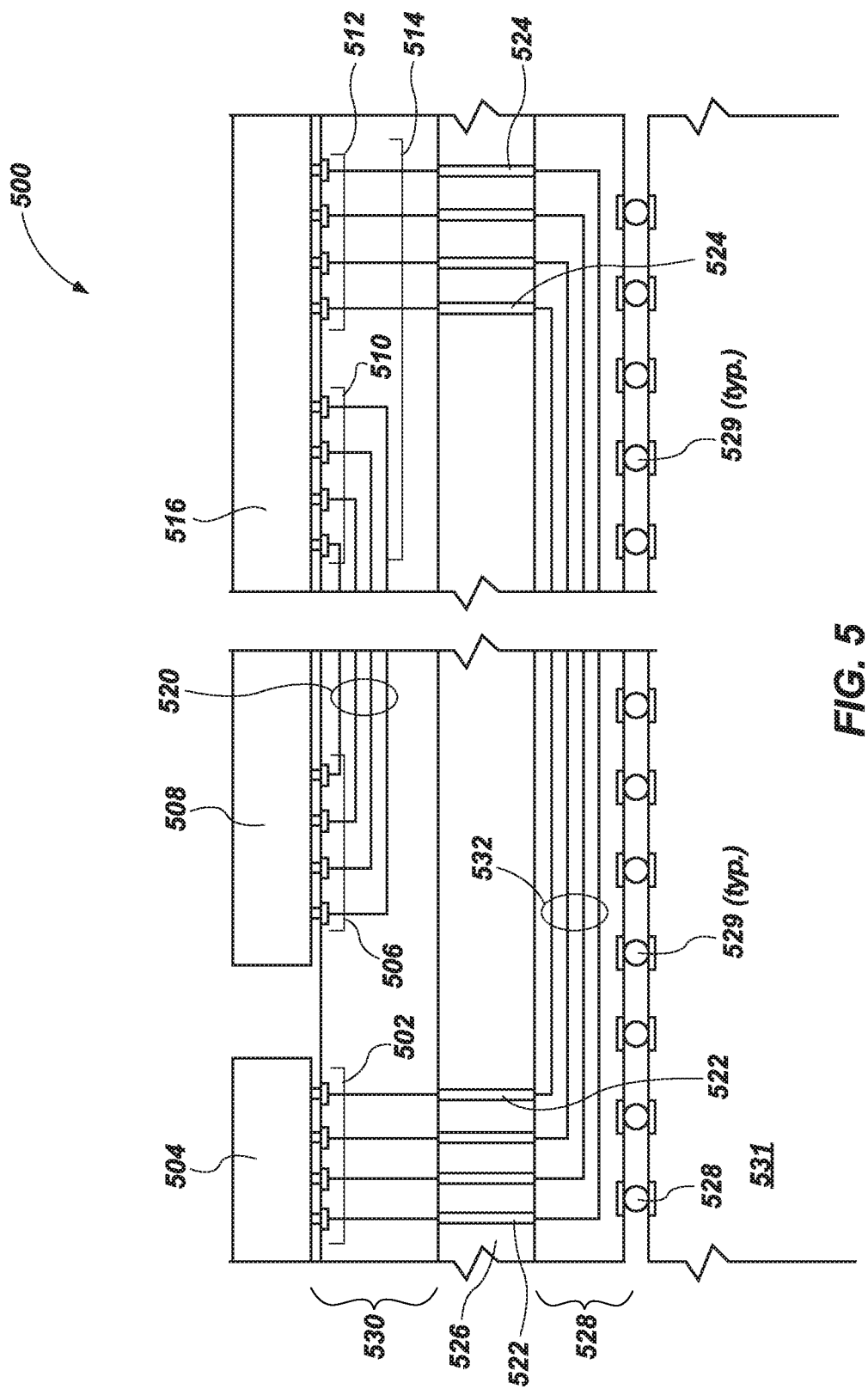
FIG. 5 is a schematic representation of a section of an interposer according to the disclosure coupled to multiple microelectronic devices showing an example signal routing between the devices.

As discussed in more detail in reference to FIG. 5, many interposers may be formed to have multiple arrays of contacts configured to interconnect with each of multiple devices (such as, in the example of FIG. 1A, processor 102 and memory devices 104A-104D). For purposes of the present description, each of the depicted devices is coupled to interposer 106 at a respective mounting site; and at each mounting site, interposer 106 includes one or more arrays of contacts arranged and configured to engage complementary arrays of contacts on each of processor 102 and memory devices 104A-104D.

Figure 1B:
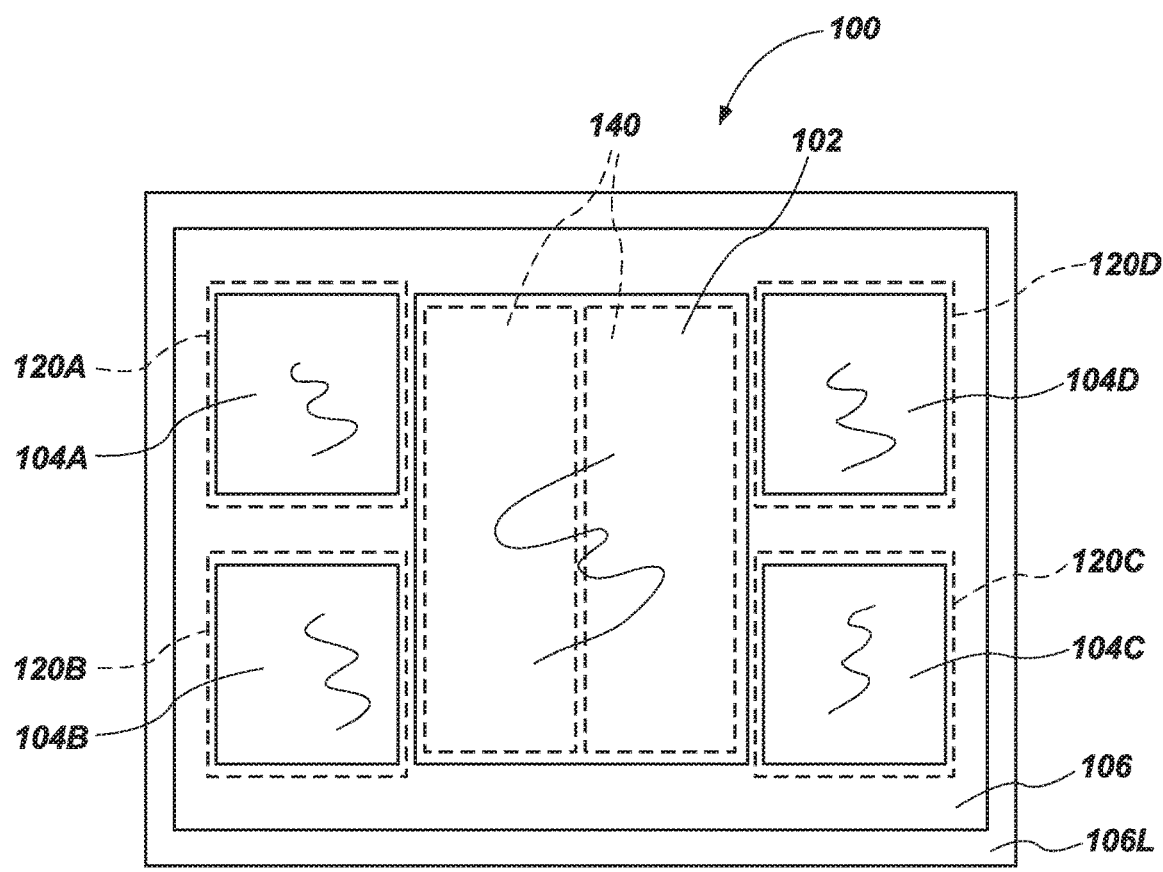
FIG. 1B is a schematic top elevation of a microelectronic device assembly of FIG. 1A, including multiple memory devices and the processor supported on and operably coupled the interposer.
Figure 1C:
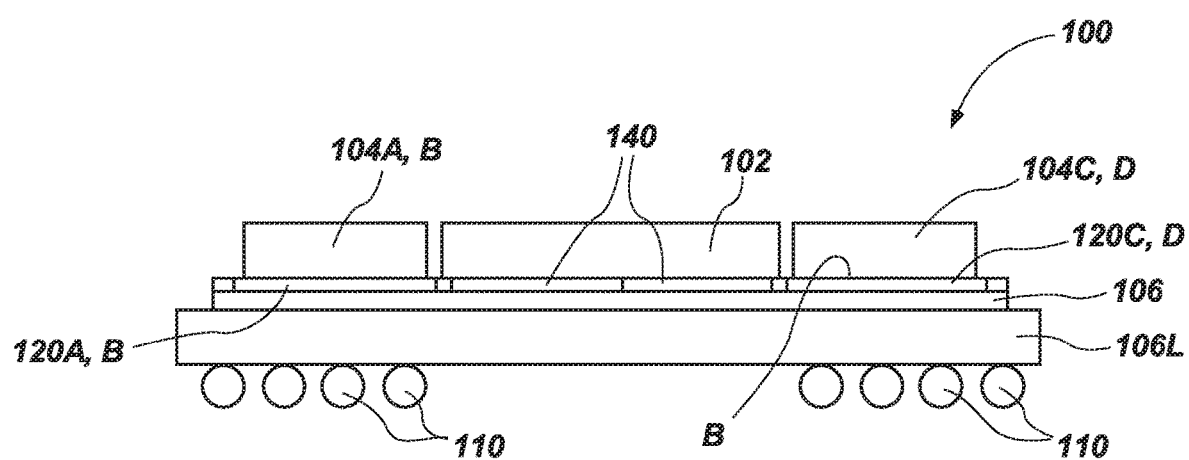
FIG. 1C is a schematic side elevation of the microelectronic device assembly of FIG. 1A and FIG. 1B according to an embodiment of the disclosure, depicting the components of FIGS. 1A and 1B with the interposer mounted to a laminate substrate having conductive elements on an opposing side thereof for connection to higher-level packaging.

FIG. 1B depicts a top elevation of one implementation of the microelectronic device assembly 100 of FIG. 1A and FIG. 1C depicts a schematic side elevation. As shown, memory devices 104A-104D are located at peripheral sites on interposer 106 on laterally opposing sides of processor 102, in this instance comprising, for example, a GPU. Notably, and as shown in broken lines in FIG. 1B within the boundaries of processor 102, cache memory in the form of SRAM 140 has been fabricated over an active surface of the silicon of interposer 106 to reside under processor 102 and operably couple processor 102 to through circuit traces of a Back End of Line (BEOL) structure B carried by interposer 106 over the active surface of the silicon to memory devices 104A-104D and to circuitry external to microelectronic device assembly 100. BEOL structure B comprises multiple layers, each comprising a dielectric material and a level of conductive traces, the various conductive levels being vertically interconnected, as known to those of ordinary skill in the art. Also as shown in FIG. 1B in broken lines within the boundaries of each memory device 104A-104D, interface circuitry segments 120A-120D have been fabricated over the active surface of the silicon of interposer 106 to reside, respectively, immediately below locations of each of memory devices 104A-104D and operably couple memory devices 104A-104D to processor 102 through conductive traces of BEOL structure B. Circuitry of interposer 106 is operably coupled to circuitry of laminate substrate 106L through TSVs extending through interposer 106, circuitry of laminate substrate 106L being operably coupled to discrete conductive elements 110 for connection to higher-level packaging.

Figure 1D:
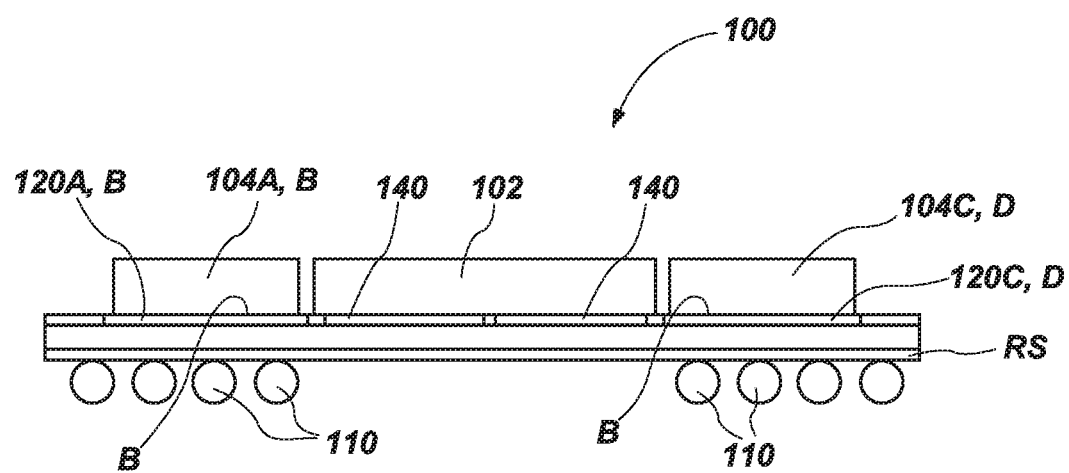
FIG. 1D is a schematic side elevation of the microelectronic device assembly of FIG. 1A and FIG. 1B according to an embodiment of the disclosure, depicting the components of FIG. 1A and FIG. 1B without a laminate substrate, the interposer having conductive elements on a side thereof opposite the microelectronic devices for connection to higher-level packaging.

FIG. 1D depicts a side elevation of another implementation of the microelectronic device assembly 100 of FIG. 1A. As depicted in FIG. 1D, a laminate substrate is omitted from the assembly, in lieu of which interposer 106 has a redistribution structure RS fabricated on the underside thereof, as described in more detail below. Redistribution structure RS comprises one or more redistribution layers (RDLs), each RDL comprising a dielectric material and a level of conductive traces. Redistribution structure carries discrete conductive elements 110 on under-bump metallization (LBM) as is known to those of ordinary skill in the art.

In the embodiment of FIGS. 1A through 1D, it will be apparent to those of ordinary skill in the art that placement of cache memory in the form of SRM in close proximity to, and immediately below the GPU reduces signal length and latency while relieving the GPU of SRAM which would otherwise consume valuable real estate and simplifying the processor design.

Figure 1E:
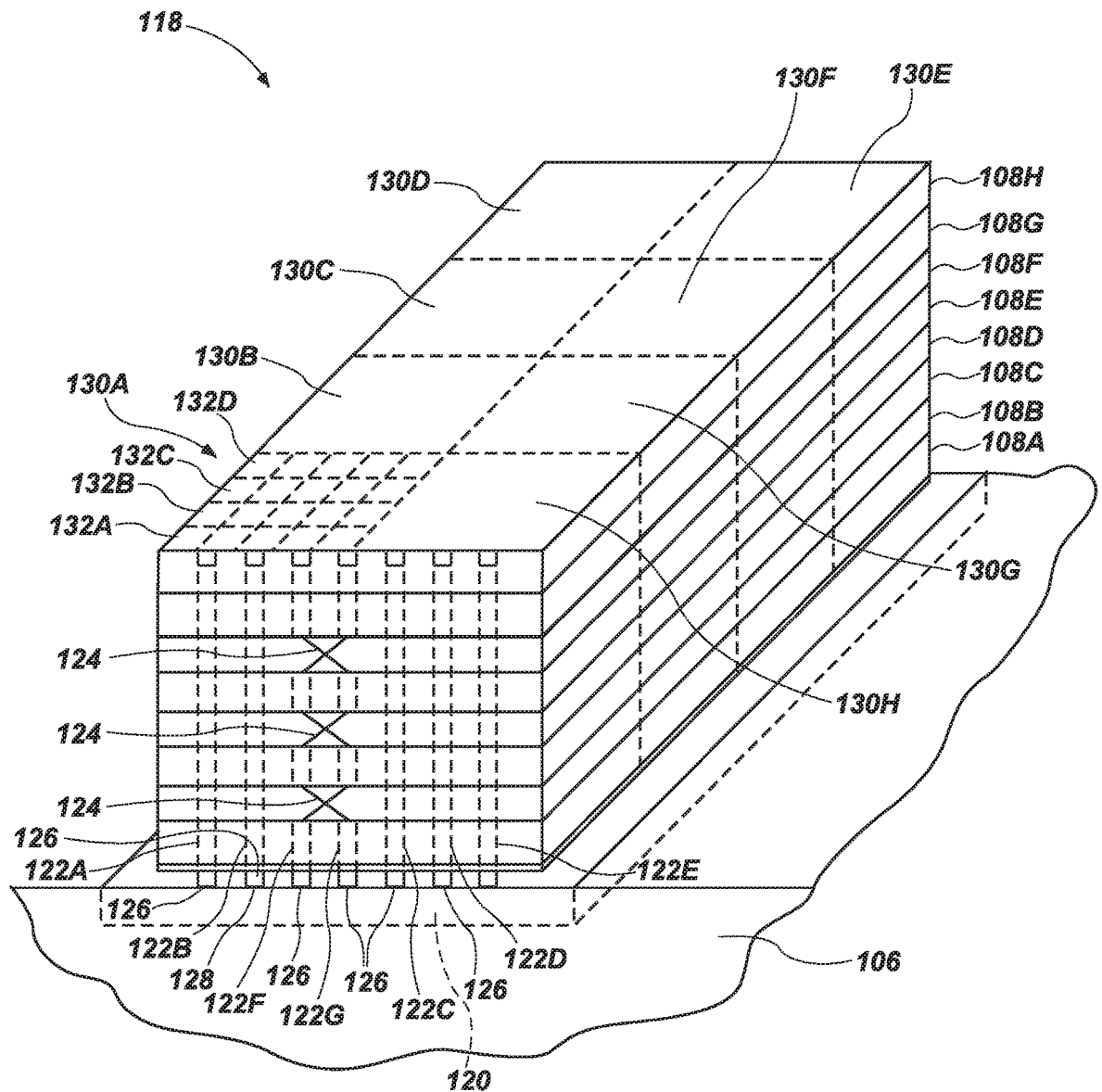
FIG. 1E is a schematic perspective view of a memory device of FIG. 1A in the form of an HBM cube including multiple memory dice stacked on an interface circuitry segment integrated within the interposer.

FIG. 1E depicts an example memory device 118 suitable for use in microelectronic device assembly 100 of FIG. 1A as memory devices 104A-104D. Memory device 118 includes, as an example, eight individual memory die 108A-108H that are vertically stacked and interconnected. As noted previously, memory device 118 may include only a single memory die, or any other number of stacked memory die for example, two memory die, four memory die, and/or more than eight memory die.

One example structure for forming the vertical interconnections includes multiple through silicon vias ("TSVs"). Though the term "through silicon vias" ("TSVs") taken literally suggests vias that extend through a silicon body, the term is conventionally used in the art to refer to vertical interconnects extending through not only silicon, and not only semiconductors, but to vertical interconnects extending through other materials as well. The term is used herein in this broader meaning, and as used herein does not imply that the described vias may extend only through a silicon body.

Each memory die 108 includes multiple memory cells that are programmable to store different logic states. For example, each memory cell may be programmed to store one or more logic states (e.g., a logic '0', a logic '1', a logic '00', a logic '01', a logic '10', a logic '11'). The memory die may use one or more of different storage technologies to store data including DRAM, SRAM, ferroelectric RAM (FeRAM), Resistive RAM (RRam or ReRAM), phase change memory (PCM), 3D XPoint™ memory, NAND flash memory, NORflash memory, or other memory technologies known to persons skilled in the art, and/or a combination thereof.

In a memory device such as 118, all of the stacked memory die may implement a first memory technology (e.g., DRAM); or alternatively one or more of the stacked memory die may include memory cells of a different storage technology different from the first memory technology. Alternatively, any of the above types of memory devices may be stacked in combination within memory device 118.

Additionally, memory device 118 depicts a configuration in which the stacked memory die are stacked above an interface circuitry segment 120 of interposer 106. Interface circuitry segment 120 can be any of many different configurations, and when present, may implement logic functions relating to operation or management of the memory die of a memory device 104A-104D stacked on an associated interface circuitry segment 120A-D. The interface circuitry segment 120 interfaces with other circuitry of interposer 106 and with processor 102 through BEOL structure B. In some embodiments, the lowermost memory die 108A will include contacts 126 for interfacing with an associated interface circuitry segment 120. In many examples, the contacts 126 will be arranged in one or more arrays configured to engage a respective device mounting site comprising contacts 128 of an interface circuitry segment 120 of interposer 106.

In some examples, the vertically interconnected memory die 108A-108H may be interconnected through an array of TSVs extending essentially linearly and vertically through the stacked memory die 108 (though not necessarily through the uppermost stacked memory die 108H), as depicted at 122A, 122B, 122C, 122D, 122E. In one of many alternate configurations some TSVs through individual die may be cross-connected to interleave vertical connections through the stacked memory die. For example, in one such embodiment, as depicted, the conductive paths may alternate between TSV paths in alternate die within the stack, as schematically depicted at 124, in conductive paths 122F-122G. Other, more complex, interleaved conductive paths may also be implemented. In some examples, one or more of the conductive paths as will connect to each of the stacked memory die; while in other examples a vertical conductive path may only electrically connect to communicate with other circuitry in a subset of the stacked memory die. For example, in the context of memory device 118 some TSVs might extend directly through the lowermost memory die 108A-108D without connecting with other circuitry; and form electrical interconnections with circuitry only in the upper half of the stacked memory die 108E-108H. In other examples, TSVs might form electrical connections only with alternating die within a stack of memory die.

Additionally, individual memory die 108A-108H, or some portion thereof, may each contain multiple partitions (as indicated at 130A-130H on memory die 108H). Some or all of memory die 108A-108H may be partitioned similarly. These partitions (or some subset thereof), may be vertically interconnected with corresponding partitions of other memory devices in the stack through the above discussed vertical connections, forming an independently operable memory unit. In some examples, the memory unit can include two or more vertically aligned partitions; and in some examples may include vertically aligned partitions from all memory die in the stack. As indicated in partition 130A, each partition may be further subdivided into multiple banks or other subdivisions, such as individual memory channels. As one example, four banks (as indicated at 132A-132D, defining four banks) are formed within partition 130A, with each bank including further subdivided units, for example representing individual memory channels (indicated typically at 134). In some examples, these further subdivisions will be vertically interconnected in the same manner as described for the partitions to include portions of memory in multiple, or all, memory die in the stack, which may then be operated as a group.

Figure 2:
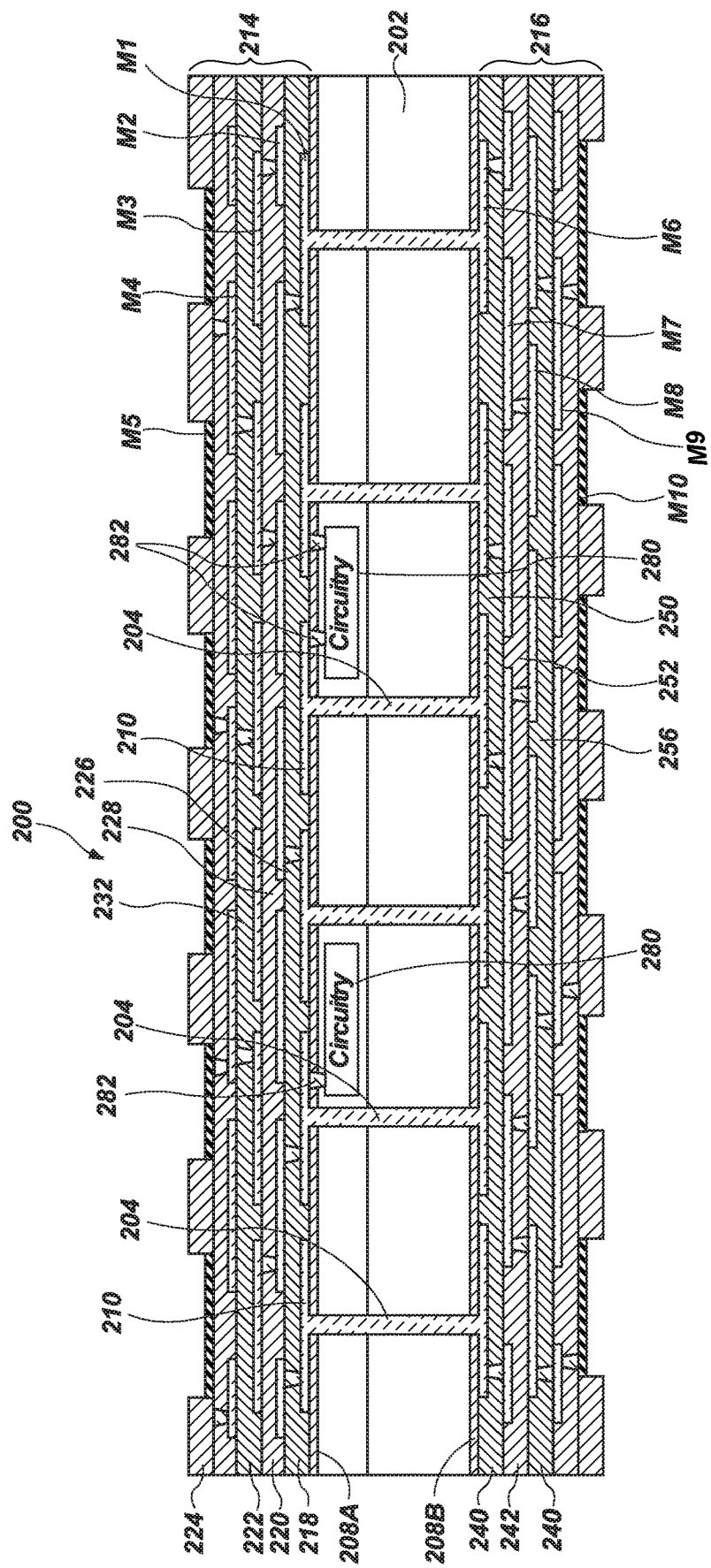
FIG. 2 is a side sectional schematic elevation of an interposer structure according to another embodiment of the disclosure.
Figure 3A:
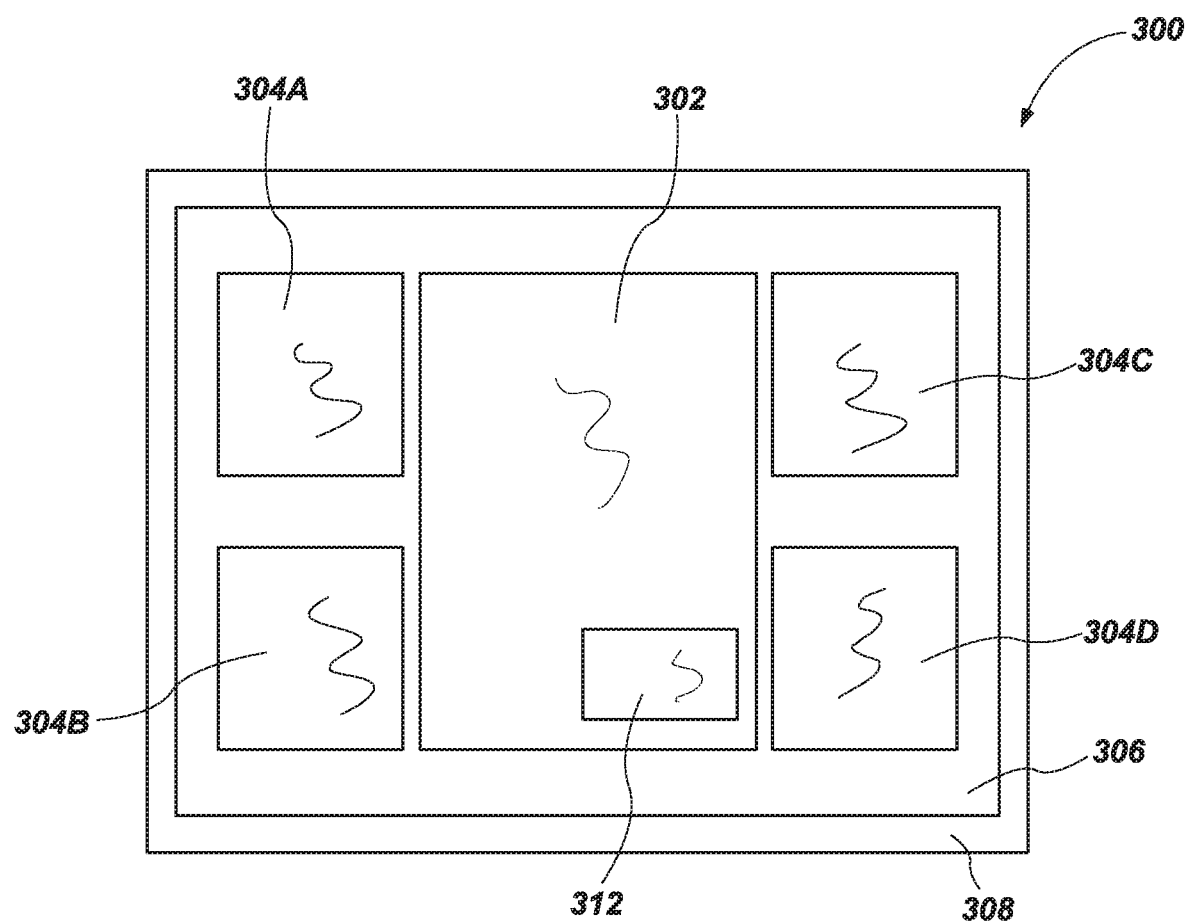
FIG. 3A is a schematic top elevation of a conventional microelectronic device assembly comprising a host device and multiple memory devices.
Figure 3B:
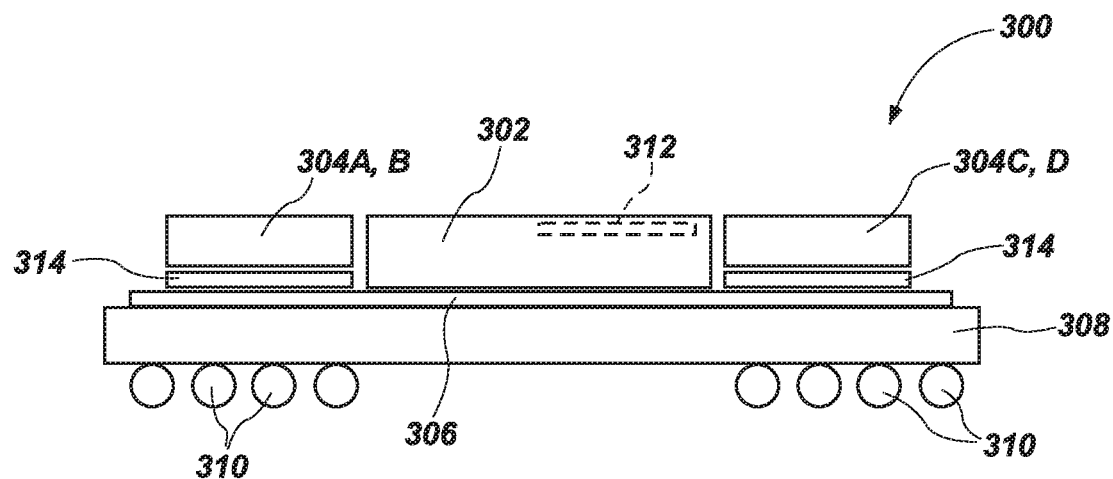
FIG. 3B is a schematic side elevation of the microelectronic device assembly of FIG. 3A.

Referring now to FIG. 2, the figure depicts a simplified cross-sectional representation of another embodiment of interposer 200. Interposer 200 includes a semiconductor core, which for purposes of the present example will be described as a silicon core 202 having multiple TSVs 204 extending through silicon core 202. As is known to persons skilled in the art, TSVs 204 each include a conductive structure, commonly a metal, extending within an insulator isolating the conductive structure from the surrounding silicon. By utilizing a silicon core 202, TSVs can be arranged in a more compact spacing than would be feasible with current organic interposer technology. In some examples, for example, TSVs may be arranged at a pitch of 40 µm or less, for example, a pitch of approximately 20 µm. In many examples, the pitch of at least some portion of the TSVs will be sized to match a contact pitch of the semiconductor die or other devices coupled to interposer 200. In such examples, the contact pitch of TSVs can correspond to the contact pitch(s) of the die or other device coupled to interposer 200. In the depicted example, a conductive level (designated M1 and M6, respectively) extends "over" each respective side of core 202, each conductive level electrically insulated from the core 202 by a respective dielectric level 208A, 208B (which may include one or more dielectric materials). The term "over" is used in the present description for clarity, and refers to the material or level being relatively outward from the core 202. As will be recognized by persons of skill in the art, the materials and structures to one side of the core will typically be formed at different times, during which the respective side of the core over which a material is being formed will face directionally upward. Similarly, the term "under" is used herein to denote a structure closer to the core.

Conductive levels M1, M6 will in many examples be patterned to define conductive traces 210, at least some of which will interconnect with respective TSVs 204, as depicted. Some conductive traces 210 may not connect with respective TSVs, and may just provide interconnection for conductive traces formed above conductive levels M1, M6. The term "redistribution layer" or "RDL" is used in the industry in multiple contexts sometimes to refer to a single level of a multi-level structure, and sometimes to refer to the multi-level structure itself. Herein, for clarity, the term "redistribution layer" or "RDL" is used to refer to a respective dielectric level supporting a respective metal level (as discussed below); and the term "redistribution structure" or will be used to refer to multiple overlying individual RDLs as a group. Redistribution structures as described herein may be fabricated using BEOL techniques known to those of ordinary skill in the art and may correspond in structure and function to BEOL structures B as previously described herein with respect to FIGS. 1B through 1D.

A first redistribution structure 214 may be formed over a first side of core 202, and, optionally, a second redistribution structure 216 may be formed over an opposite, second, side of core 202. Each redistribution structure 214, 216 includes multiple respective redistribution layers (RDLs). Each of the multiple RDLs, in the example, each redistribution structure 214, 216 includes four RDLs. In redistribution structure 214, RDLs 218, 220, 222, 224, extend over a first side of core 202 and metal level M1 formed thereon. Each RDL includes a respective dielectric level 226, 228, 230, 232, each dielectric level 226, 228, 230, 232 supporting a respective metal (or other conductive material) level M2, M3, M4, M5.

Redistribution structure 216 discloses a complementary structure including four RDLs, 240, 242, 246, 248, each including a respective dielectric level 250, 252, 254, 256 supporting a respective metal, or other conductive material, level M7, M8, M9, M10 extending over the second side of core 202 (and metal level M6 formed there over). In the depicted example, each RDL metal level M2, M3, M4, M5, and M7, M8, M9, M10 forms vertical interconnects (for example, micro-vias) through the supporting dielectric level, to a metal level below. Each metal level M1-M10 will preferably be patterned to collectively form conductive traces to redistribute contacts of a semiconductor die or other microelectronic device or structure mounted to interposer 200 to desired locations within interposer 200.

In some examples, all metal levels M1-M10 may be formed of the same metal. In other examples, however, outermost metal levels M5 and M10 will typically form surfaces for connecting (directly or through an interconnection structure) with complementary contact structures of another device. In the case of top outermost metal level M5, the level will form surfaces suitable connecting with contacts of a semiconductor die, or other microelectronic device. In the case of bottom outermost metal level M10, in many examples the level will form contact surfaces configured to connect through other structures, such as discrete conductive elements in the form of balls, bumps, studs, columns or pillars of a metal or metal alloy (without any implication as to the actual shape of the contact structures), as may be used to connect with an external structure, in many cases, a printed circuit PC board, for example a motherboard of a computing system or other higher level packaging. As a result of the different functions of these metal levels, and the likely exposure of the metal to potentially oxidizing environments after formation, in some examples one or both of the outermost metal levels may be formed of another conductive material that oxidizes more slowly than the metal used for used for other levels. For example, for examples in which metal levels M1-M4, and M6-M9 are formed of copper, one or both of outermost metal levels M5 and M10 may be formed of aluminum. As will be apparent to persons skilled in the art having the benefit of this disclosure, other conductive materials and/or other metals may be used for any one or more of conductive levels corresponding to M1-M10.

In many examples, the dielectric levels of the RDLs will comprise primarily, or in significant part, a polyimide compound. In general, a polyimide compound will be more elastic, and less prone to cracking, than other dielectric materials used in other locations in semiconductor manufacturing (such as silicon oxide (in various forms), silicon nitride, etc.). Additionally, the polyimide material may be formed at lower temperatures than other materials used in build-up applications, thereby minimizing stress on core 202 during manufacture of interposer 200. The inclusion of multiple RDLs on each side of core 202 will help to stabilize core 202 against warping, cracking, or other distortions, and thereby improve the integrity of the microelectronic device assembly incorporating the interposer 200.

For some examples, it will be desirable to form interposer 200 with the same number of multiple RDLs in redistribution structure 214 as are in redistribution structure 216. In some such examples, that symmetrical structure on both sides of the core may assist with balancing the above reinforcement of the semiconductor core. Also, as discussed later herein, in some examples the symmetrical structure may also be beneficial to conveying signals in multiple conductive channels (e.g., in some examples, with a first conductive channel implemented at least in part through metal levels M2-M5 in first redistribution structure 214, and a second conductive channel implemented at least in part through metal levels M7-M10 of second redistribution structure 216). Also as discussed later herein, there may be an unequal number of RDLs on opposite sides of the core, and individual RDLs may have vertical dimensions different than other RDLs on the same side of the core, and/or on the opposite side.

Interposer 200 further includes circuitry 280 formed within the dimensions of core 202. In some embodiments, circuitry 280 may include passive components (such as resistors, inductors, capacitors) that may be formed, at least in part, in the bulk semiconductor (silicon) of core 202. In other examples, the components may be formed, at least in part, of materials deposited in recesses formed in core 202. In some examples, the passive components may be formed entirely within the dimensions of the core. In such examples, individual circuit elements may connect outside of the core through interconnection to one or more TSVs 204 extending through core 202, or through one or more micro-vias 282 formed as a portion of M1 formed over the upper surface of core 202, and extending through dielectric level 208A over the first surface of core 202. In some cases, multiple passive components may be connected to one another. For example, resistors and capacitors may be coupled together to form a resistor/capacitor circuit. As one example, such a resistor/capacitor circuit, or an inductor, may be coupled and adapted to condition signals on conductive traces extending through one or more of the RDL layers of redistribution structure 214.

In embodiments of the disclosure, active circuit components may be located within the dimensions of core 202. Many forms of circuitry including active components will beneficially be formed with one or more bodies within the bulk silicon of core 202, with one or more additional bodies formed in materials extending over core 202. In many forms of such devices, regions of silicon core 202 may be isolated from one another by shallow trench isolation in silicon core 202; and isolated regions of silicon core 202 may be doped relative to the remaining silicon of silicon core 202. Specifically, and as noted above, interface circuitry segments 120 may be formed within or over core 202. In addition, as described with respect to FIGS. 1A-1D, cache memory in the form of SRAM may be formed within and over core 202 at least partially under the footprint of processor 102.

Figure 4:
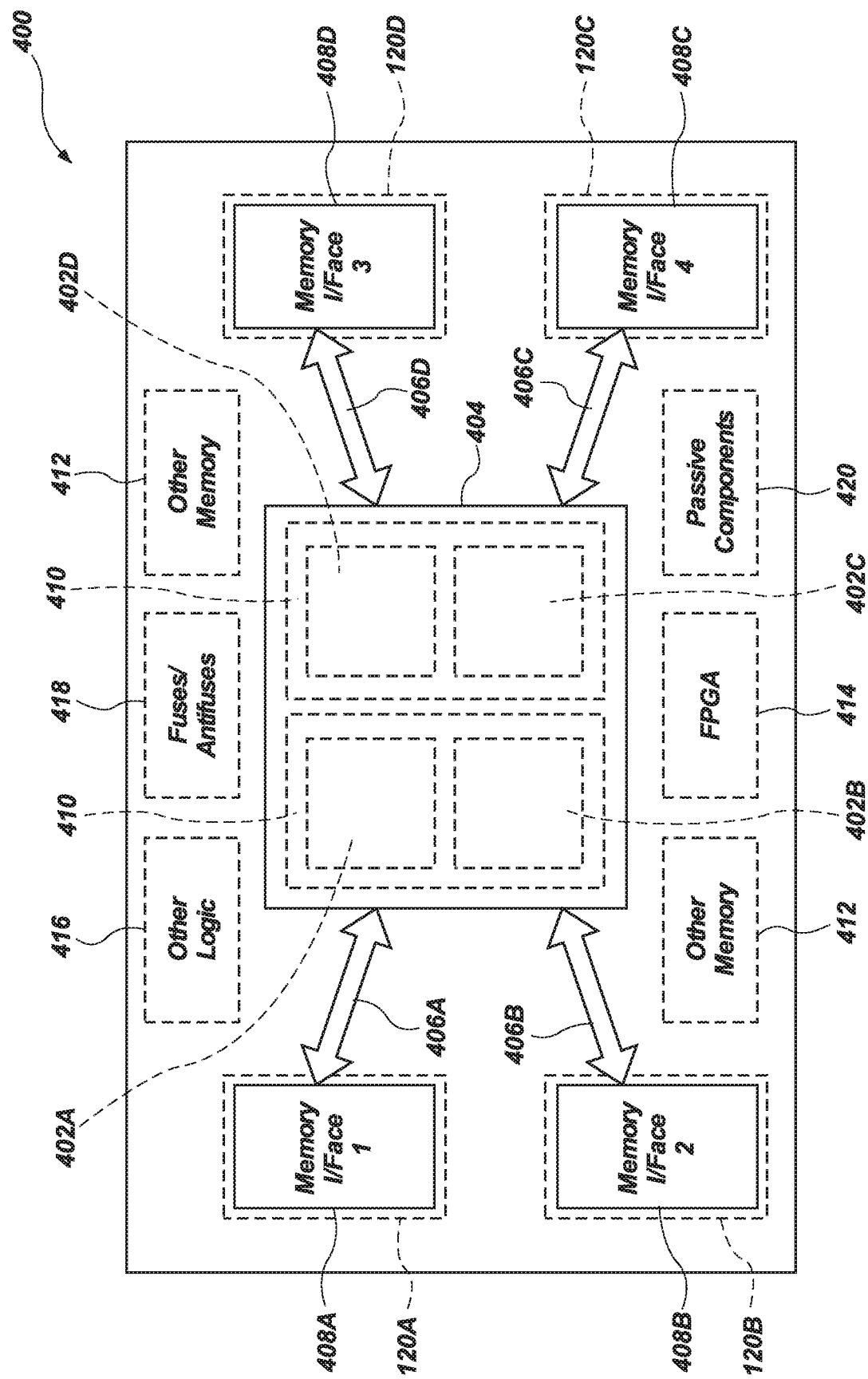
FIG. 4 is a block diagram of an embodiment of a microelectronic device assembly incorporating an interposer in accordance with an embodiment of the disclosure.

Referring now to FIG. 4, the figure depicts a block diagram representation of an example configuration for an interposer 400, including example optional circuit componentry may be formed in accordance with the description herein. Interposer 400 is analogous to interposer 106 of FIG. 1A, in that it defines metallization configured to form processor interfaces 402A, 402B, 402C, 402D for four memory devices, as part of a processor interface operably coupled to SRAM 410 located under the footprint of processor 404 and additionally configured for external communication to other devices. Each processor interface 402A, 402B, 402C, 402D may communicate data, command, and control signals between the memory devices and the processor through cache memory in the form of SRAM 410 to and through a respective communication channel 406A, 406B, 406C, 406D extending to four memory interfaces 408A, 408B, 408C, 408D corresponding to interface circuitry segments 120A, 120B, 120C, 120D as described with respect to FIGS. 1A-1E. The particular configuration of metallization for each processor interface 402A, 402B, 402C, 402D, and also the contact array of each memory interface 408A, 4089, 408C, 408D can be adapted to a desired configuration, such as may be dictated by a standardized interface.

The ability to configure interposer to include active and/or passive circuit components facilitates the forming of logic structures such as interface circuitry segments 120A-120D and/or additional structures, for example cache memory in the form of SRAM 410, within the interposer to simplify incorporating such circuit components into the microelectronic device assembly to be formed with interposer 400. In addition to cache memory, such as SRAM 410, another form of memory 412 may be formed within or over core 202, such as, by way of example only, any of DRAM, ferroelectric random-access memory (FeRAM), phase change memory (PCM), 3D XPoint™ memory, NAND flash memory, NOR flash memory, resistive random-access memory (ReRAM or RRAM), or other memory types known to persons skilled in the art, and/or a combination thereof.

Additionally, logic structures in addition to those of interface circuitry segments 120A-120D may be formed in interposer 400. Such logic structures may be in the foils of Field-Programmable Gate Arrays (FPGAs) 414, or other types of logic 416. Additionally, configuration circuitry, as may be used to tune or trim circuits or to enable or disable circuit components, such as fuses or anti-fuses 418, can be formed in interposer 400. And, as discussed previously passive circuit components 420, such as, for example components to condition signals traversing interposer 400 may also be formed.

For clarity of the block diagram representation, the different circuit components are depicted surrounding, but offset from, processor 404. However, the ability to incorporate such circuit components into interposer 400 facilitates placing the circuit components in a desired location within interposer 400, such as placement of cache memory in the foils of 410 under the footprint of processor 404 and interface circuitry segments 120A-120D, as better illustrated in FIGS. 1B, 1C and 1D. Any of the above memory, logic, or configuration circuitry may communicate through connected TSVs to the opposite side of interposer 400.

Referring now to FIG. 5, the figure depicts a simplified schematic representation of an example signal routing in an interposer 500 between multiple mounting sites and semiconductor components. Interposer 500 is depicted with a first device interface 502 configured to form a first mounting site for establishing connection with a first memory device 504; and a second device interface 506 forming a second mounting site for establishing connection with a second memory device 508. Each of first device interface 502 and second device interface 506 connect with respective contact arrays 510, 512 forming at least a portion of a third device interface 514, forming a third mounting site, such as for a processor 516. The conductive traces 520 extending transversely between device interface 506 and contact array 510 can be distributed between multiple RDLs 530 extending above core 526. Similarly, the conductive traces 532 extending transversely between device interface 502 and contact array 512, may connect to TSVs 522 extending through core 526, and through multiple RDLs 528, and then again through a second group of TSVs 524 to connect to contact array 512. The arrangement of contacts in each contact array and the configuration of the conductive traces may be configured to establish generally equal length conductive paths at least for selected conductive traces communicating with an individual memory device.

In some example implementations, the transverse traces of the two conductive channels may not extend directly one above the other, as depicted in FIG. 5. Where the transverse traces of a first conductive channel extend in a region of a redistribution structure in which there are no active transverse traces on the opposite side redistribution structure, it may be desirable to include "dummy" metallization in the opposite side redistribution structure to maintain, to the extent possible, symmetry of the physical properties of the two redistribution structures. Again, the objective being to avoid compositional variances that could impart stress to core 526.

FIG. 5 depicts external contacts, at the lower surface of interposer 500 providing contacts 529 (in the depicted example form of solder balls) to an external component 531. In many example configurations, external component 531 will be a PC board or analogous structure serving to interconnect the assembly formed on interposer 500 within a larger electronic system.

The incorporation of logic gates and memory into the structure of described interposers was previously identified. As was described, for many such structures, particularly those including active components, forming one or more bodies of the components in the silicon of the interposer core may be desirable, with one or more bodies of the components formed in materials formed over the core. An example manner of a structure incorporating such active components and related structures into the interposer core will be discussed in reference to FIG. 6.

Figure 6:
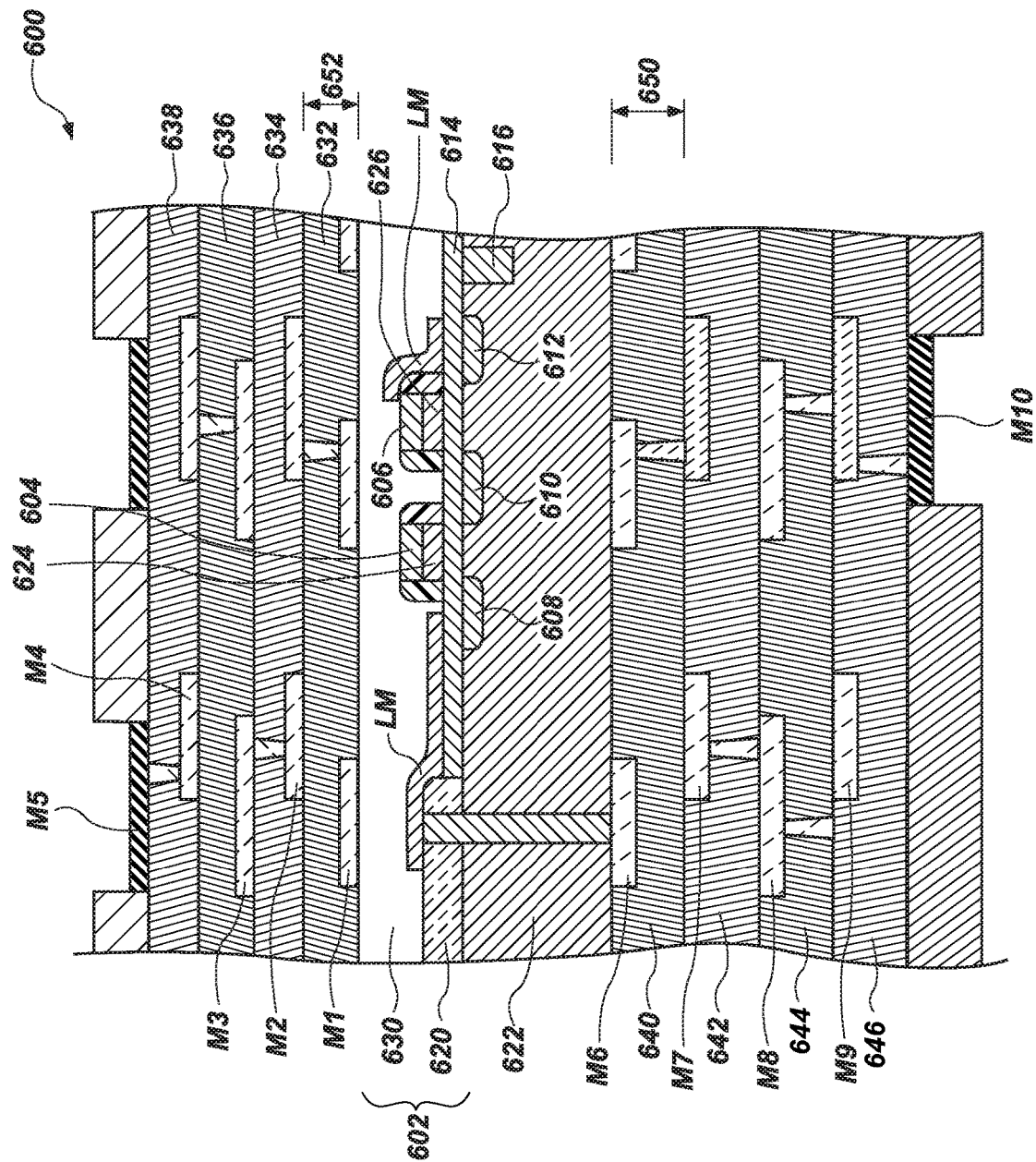
FIG. 6 is a simplified cross-sectional representation of an example section of an embodiment of an interposer incorporating logic structures.

FIG. 6 depicts an example interposer 600 including circuit elements, including logic gates as previously discussed in reference to interposer 200 of FIG. 2. FIG. 6 depicts a logic structure 602 formed above core 622. In the depicted example, logic structure 602 includes coupled transistors 604, 606. Each transistor 604, 606 includes source/drain regions 608, 610, 612 formed by doping selected regions of core 622. In some examples, in which such transistor gates are to be formed, it may be desirable to remove at least a portion of dielectric level 620 formed over silicon core 622, in order to form another dielectric material, indicated at 614, optimized to form a gate oxide for the transistors. In regions outside the logic gates, dielectric level 620 may remain intact. In some examples, it may be advantageous to isolate portions of silicon core 622 adjacent one or more circuit components, such as by forming shallow trench isolation, as indicated at 616 within silicon core 622. Forming of transistors 604, 606 can include forming one or more conductive gate materials 624, 626 (such as, for example, doped polysilicon) over the gate oxide 614; and isolating the sidewalls of the gates with spacers, as depicted. Also, as discussed previously, electrical connection between circuitry can be made with one or more conductive levels, such as one or more logic metal (LM) materials within the logic region. In order to provide a planar surface on which to form the previously-described RDLs, where, as in the example, the circuit components extend above the surface of silicon core 622, an insulating material 630, for example such as TEOS, may be formed above the logic circuitry and planarized.

Additionally, though not depicted for clarity, circuit components may also be formed on the opposite side of silicon core 622. The circuitry on the opposite side can either be similar to that on the first side, or of a different configuration.

In the example of interposer 600, in order to help promote stability and durability of silicon core 622, RDL layers 632, 634, 636, and 638 on the first side of core 622, and above logic structure 602 are all formed with a first vertical dimension, which in the example of interposer 600 is a uniform vertical dimension (indicated at 652) of those layers. However, in the depicted example, in view of the vertical dimension of logic structure 602 (including the insulating material above), in order to avoid imbalances on opposite sides of the core, each of the four RDL layers 640, 642, 644, 646 on the second side of core 622 have a greater vertical dimension (indicated at 650) than that of each of RDL layers 632, 634, 636, 638 (indicated at 652). This facilitates the structure formed on the first side of core 622, and the structure formed on the second side of core 622 to have a comparable, ideally (in this example) identical vertical dimension (within the tolerances of manufacturing). In other examples, one or more RDL layers on either side of the core may be constructed with a different vertical dimension from other RDL layers on that same side of the core and/or from RDL layers on the opposite side of the core.

Figure 7A:
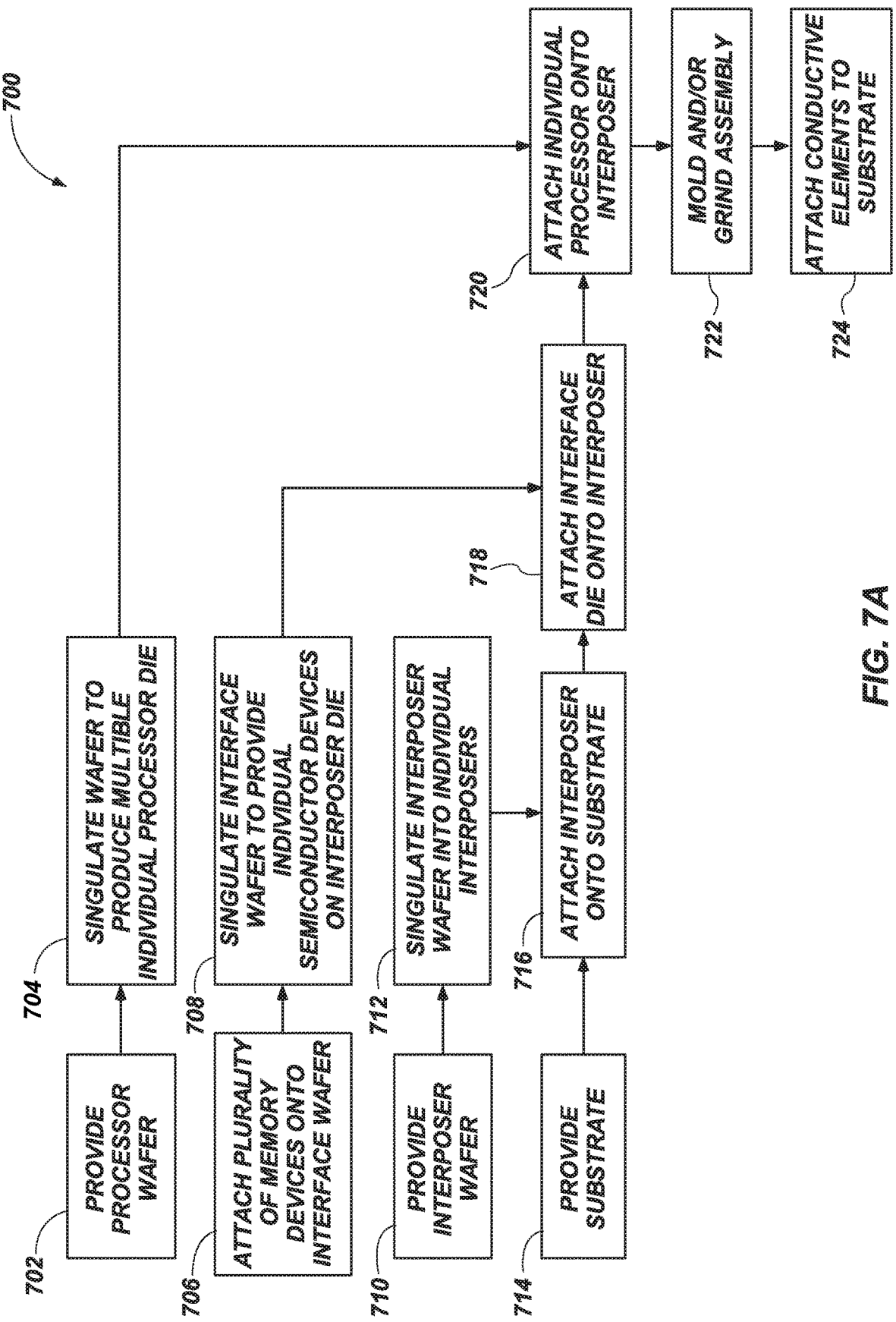
FIG. 7A is a flow chart of a conventional process sequence for fabrication of microelectronic assembly of FIGS. 3A and 3B.
Figure 7B:
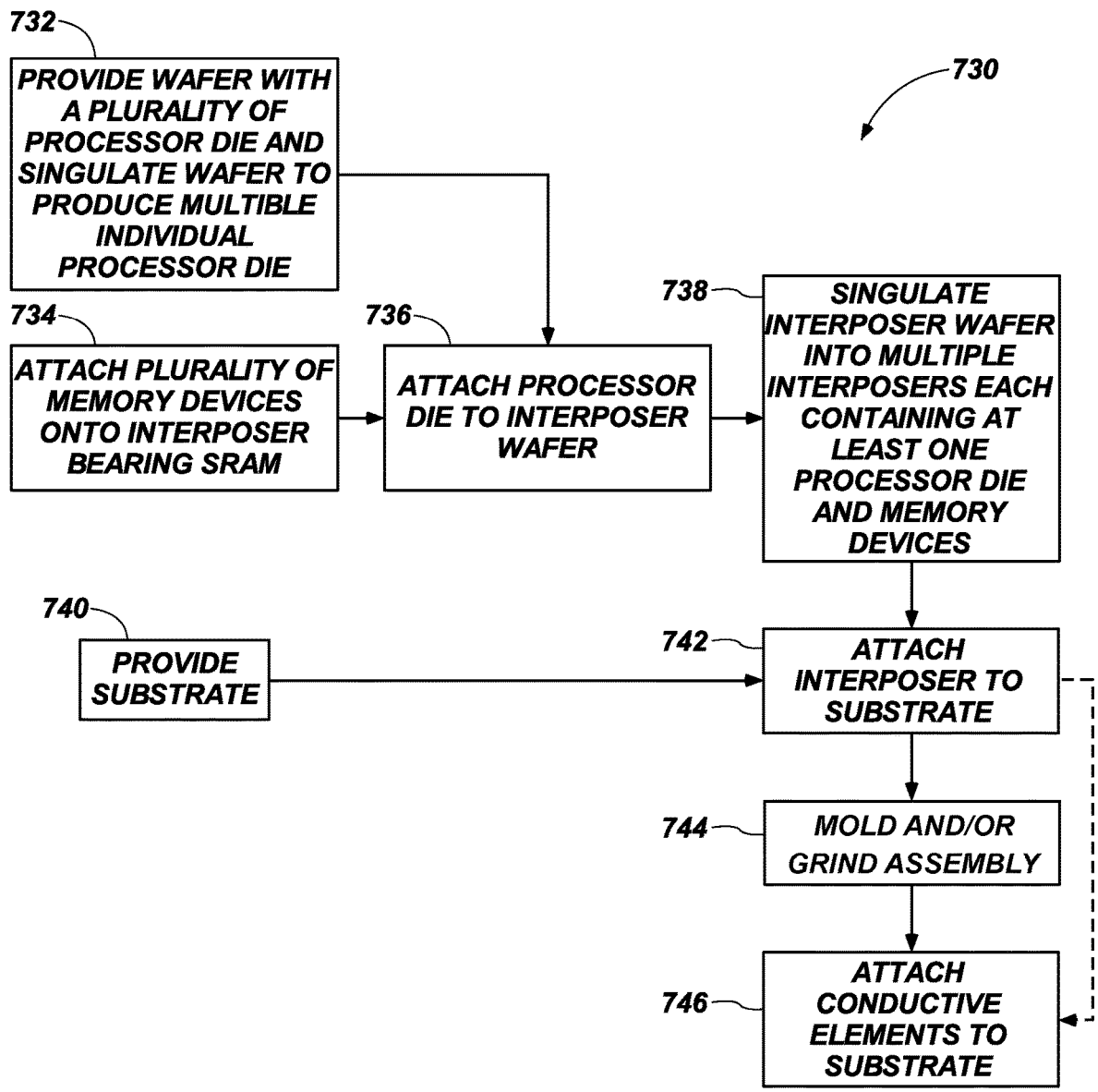
FIG. 7B is a flow chart of a process sequence according to embodiments of the disclosure for fabrication of microelectronic device assemblies of FIGS. 1A through 1D.

For purposes of further distinguishing embodiments of the disclosure from the state of the art, flow charts for a process sequence of fabricating a conventional microelectronic device assembly comprising a host device and multiple memory devices mounted to an interposed and a process sequence of fabricating a microelectronic device assembly comprising a host device and multiple memory devices according to embodiments of the disclosure are respectively depicted at FIGS. 7A and 7B.

Referring to FIG. 7A, as indicated in an example process sequence 700 wherein cache memory is integrated with a processor, a processor wafer, for example a GPU wafer comprising multiple GPU die each with integrated cache memory in the form of SRAM is provided at 702 and singulated into GPU die as indicated at 704. At 706, memory devices (e.g., each comprising multiple stacked memory die) are operably coupled to an interface wafer comprising multiple interface (controller) circuitry locations, which assembly is then singulated into multiple memory devices each including an interface die at 708. A silicon interposer wafer comprising multiple interposer locations is provided at 710 then singulated into silicon interposers, at 712. A substrate, for example a laminate substrate (e.g., a printed circuit board) is provided at 714, and at 716 a silicon interposer is operably coupled to the substrate. One or more memory devices including an interface die are then operably couple to a silicon interposer at 718. At 720, a processor die is operably coupled to the silicon interposer. At this point, a conventional mold/grind operation is performed at 722 to encapsulate the assembly and thin the resulting package, and discrete conductive elements in the form of, for example, solder balls, are attached at 724.

Referring to FIG. 7B, as indicated in a process sequence 730 for fabricating a microelectronic device assembly according to the disclosure, a processor wafer and multiple memory devices as described herein. As indicated at 732, a processor wafer, for example a GPU wafer comprising multiple GPU die without cache memory is provided and singulated into GPU. At 734, multiple memory devices (e.g., each comprising multiple stacked memory die) are operably coupled to an interposer wafer, on which cache memory in the form of SRAM has been fabricated at each interposer location and interface (controller) circuitry at each memory device location. At 736, GPU die are operably coupled to the SRAM at interposer locations on the interposer wafer, after which each assembly of an interposer location with a GPU unit and memory devices on the interposer wafer is singulated at 738 into multiple assemblies each comprising an interposer bearing a GPU die and memory devices. A substrate, for example a laminate substrate, is optionally provided at 740, and the interposer bearing the GPU and memory devices is operably coupled to the substrate at 742. At this point, a conventional mold/grind operation is performed at 744 to encapsulate the assembly and thin the resulting package, and discrete conductive elements in the form of, for example, solder balls, are attached at 746 to form an assembly as illustrated in FIG. 1C. If a substrate is not employed (as depicted in broken lines), the mold/grind operation 744 is performed on the assembly comprising the interposer, GPU die and memory devices, and discrete conductive elements in the form of, for example, solder balls, are attached at 746.

From a review and comparison of FIGS. 7A and 7B, it may be appreciated that conventional fabrication and singulation of an interface wafer into interface die to form memory devices comprising stacked memory die and an interface die may be eliminated, and the integration of SRAM cache memory into the interposer wafer along with memory interface circuitry may reduce cost and increase yield. Further, the elimination of a laminate substrate may further reduce cost and increase yield.

Figure 8:
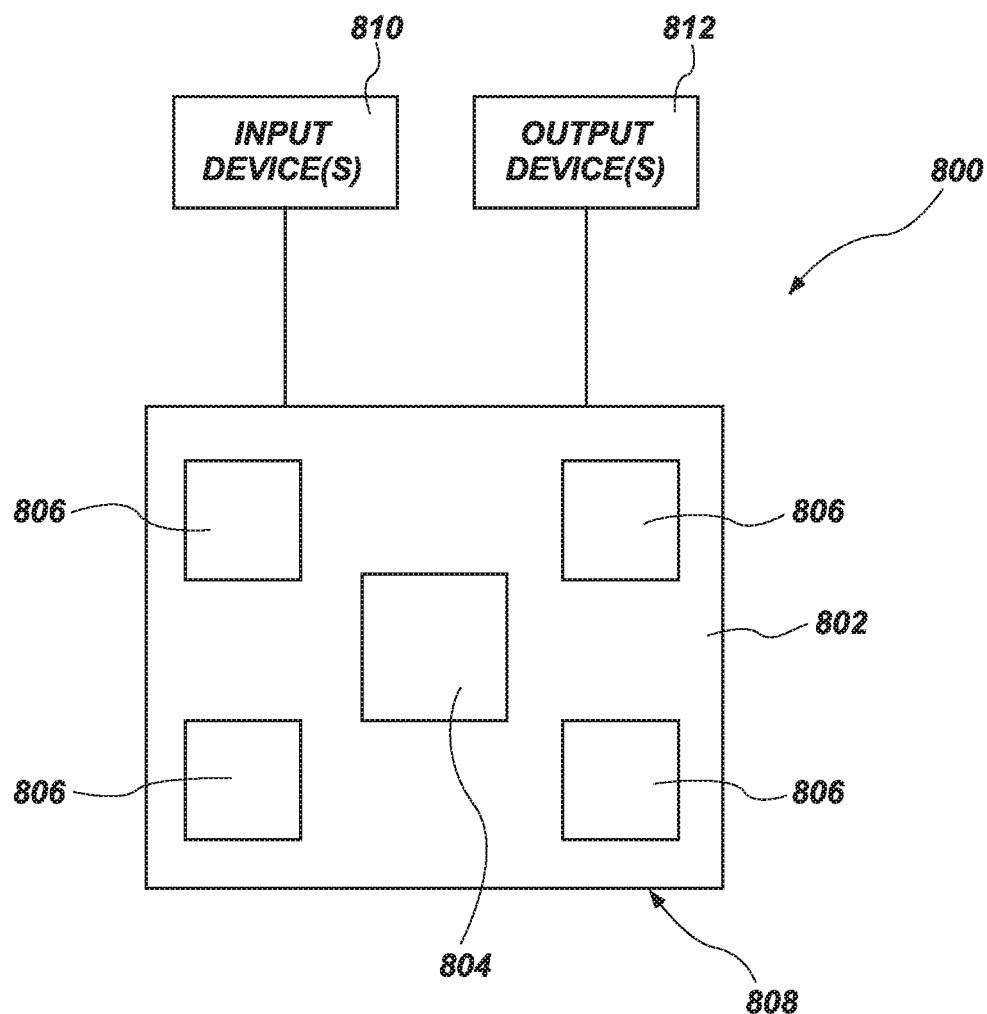
FIG. 8 is a schematic depiction of an example of an electronic system including microelectronic devices interconnected through an interposer incorporating cache memory and configured to provide high bandwidth communication channels, in accordance with embodiments of the disclosure.

FIG. 8 is a block diagram of an electronic system 800 incorporating an interposer configured according to an embodiment of the disclosure. Interposer 802 comprising a semiconductor material (e.g., silicon) and configured with SRAM, memory interface circuitry and other features as described with respect to embodiments 100, 200, 400, 500 and 600 may be employed in combination with a host device 804 and multiple memory devices 806 mounted thereto, the combination forming a microelectronic device assembly 808. Host device 804 may comprise, for example, a central processing unit (CPU), a graphics processing unit (GPU), a controller, or a system on a chip (SoC). The high bandwidth memory devices 806 may comprise, for example, HBM cubes or HMCs. The electronic system may further includes one or more input devices 810 for inputting information into the electronic system 800 via interposer 802 by a user, such as, for example, a mouse or other pointing device, a keyboard, a touchpad, a touchscreen, a button, or a control panel. The electronic system 800 may further include one or more output devices 812 for outputting information (e.g., visual or audio output) from electronic system 800 to a user such as, for example, a monitor, a display, a printer, an audio output jack, a speaker, etc. In some embodiments, the input device 810 and the output device 812 may comprise a single touchscreen device that can be used both to input information to the electronic system 800, and to output visual information to a user. Electronic system 800 may include components for bi-directional voice and data communications.

Electronic system 800 may be a computer, a server, a laptop computer, a notebook computer, a Wi-Fi or cellular-enabled tablet computer such as an iPad® or SURFACE® tablet, a mobile phone, a wearable electronic device, a personal electronic device, a digital camera, a portable media (e.g., music, video) player, navigation device, or the like. Similarly, electronic system 800 may be a portion or aspect of such a device. In some examples, electronic system is an aspect of a computer with high reliability, mission critical, or low latency constraints or parameters, such as a vehicle (e.g., an autonomous automobile, airplane, a spacecraft, or the like). Electronic system 800 may be or include logic for artificial intelligence (AI), augmented reality (AR), or virtual reality (VR) applications.

In some embodiments, an interposer for a microelectronic device assembly comprises a body extending in a plane and comprising a semiconductor material, locations on a surface of the body for operably coupling multiple microelectronic devices to circuitry of the body and cache memory over an active surface of the semiconductor material of the body operably coupled to circuitry extending to a location on the surface of the body for operably coupling a host device to the cache memory.

In other embodiments, a microelectronic device assembly comprises an interposer comprising cache memory formed over an active surface of semiconductor material, circuitry of the interposer extending between at least one host device location and one or more memory device locations, a host device operably coupled to the at least one host device location in communication with the cache memory, and a high bandwidth memory device operably coupled to each of the one or more memory device locations.

In further embodiments, an electronic system comprises an interposer including cache memory located on semiconductor material thereof, a processor over the cache memory on a surface of the interposer and operably coupled to the cache memory, multiple high bandwidth memory devices on the surface of the interposer and operably coupled to the processor, at least one input device operably coupled to the processor through the interposer and at least one output device operably coupled to the processor through the interposer.

In still further embodiments, a method of fabricating a microelectronic device assembly comprises providing a wafer comprising multiple interposer locations, each interposer location comprising cache memory, singulating a wafer comprising multiple processor die, mounting a processor die over and in operable communication with the cache memory of each interposer location, stacking multiple memory die on each interposer location in operable communication with the processor die, and singulating the interposer locations to form interposers.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An interposer for a microelectronic device assembly, comprising:
   a body extending in a plane and comprising a semiconductor material;
   locations on a surface of the body for operably coupling multiple microelectronic devices to circuitry of the body; and
   cache memory within the semiconductor material of the body of the interposer operably coupled to circuitry of the interposer extending to a location on the surface of the body for operably coupling a microelectronic host device to the cache memory.

2. The interposer of claim 1, wherein the cache memory comprises SRAM.

3. The interposer of claim 1, wherein the cache memory is located under the location on the surface of the body for operably coupling the microelectronic host device to the cache memory.

4. The interposer of claim 1, wherein the microelectronic host device comprises a central processing unit (CPU), a graphics processing unit (GPU), a controller, or a system on a chip (SoC).

5. The interposer of claim 1, wherein at least one of the locations on the surface of the body is a location for operably coupling a microelectronic memory device to circuitry of the body communicating with the cache memory.

6. The interposer of claim 5, wherein the at least one of the locations for operably coupling a microelectronic memory device to circuitry of the body communicating with the cache memory comprises an interface circuitry segment for the microelectronic memory device operably coupled to the circuitry of the body communicating with the cache memory.

7. The interposer of claim 1, wherein the semiconductor material is silicon.

8. The interposer of claim 1, wherein the semiconductor material comprises a core of the body, and further comprising a redistribution structure between the core and the surface of the body extending between the cache memory and the locations on the surface of the body.

9. The interposer of claim 1, wherein the semiconductor material comprises a core of the body, and further comprising a redistribution structure over the core and a surface of the body opposite the surface for operably coupling multiple microelectronic devices, wherein the redistribution structure is configured for communicating between the interposer and external circuitry.

10. A microelectronic device assembly, comprising:
an interposer comprising cache memory solely within semiconductor material of the interposer;
circuitry of the interposer extending between and operably coupling at least one host device location on a surface of the interposer and one or more memory device locations on the surface of the interposer;
a host device operably coupled to the at least one host device location in communication with the cache memory solely within the semiconductor material of the interposer; and
a high bandwidth memory device operably coupled to each of the one or more memory device locations.

11. The microelectronic device assembly of claim 10, wherein the cache memory of the interposer comprises SRAM and the SRAM is located within the interposer at least partially under the at least one host device location.

12. The microelectronic device assembly of claim 10, wherein the high bandwidth memory device is either an HBM cube or an HMC.

13. The microelectronic device assembly of claim 10, wherein each of the one or more memory device locations comprises logic circuitry for interfacing with the high bandwidth memory device.

14. The microelectronic device assembly of claim 10, wherein the host device comprises a central processing unit (CPU), a graphics processing unit (GPU), a controller, or a system on a chip (SoC).

15. The microelectronic device assembly of claim 10, the interposer further comprising circuitry for operably coupling the host device to circuitry external to the interposer through discrete conductive elements over a surface of the interposer opposite the at least one host device location and the one or more memory device locations.

16. The microelectronic device assembly of claim 10, wherein the semiconductor material comprises a core of the interposer, and further comprising a redistribution structure over the core and comprising the circuitry extending between at least one host device location and one or more memory device locations and another redistribution structure over the core opposite the redistribution structure and comprising circuitry for communicating between the host device and higher level packaging.

17. An electronic system, comprising:
an interposer including cache memory located within semiconductor material thereof;
a processor device on a surface of the interposer over the cache memory located within the semiconductor material of the interposer and operably coupled to the cache memory; and
one or more high bandwidth memory devices on the surface of the interposer and operably coupled to the processor device.

18. The electronic system of claim 17, wherein the interposer further comprises memory device interfaces comprising memory controller circuitry formed on and within the semiconductor material of the interposer immediately below and operably coupled to each of the high bandwidth memory devices.

19. The electronic system of claim 17, wherein the semiconductor material comprises silicon, and the silicon comprises a core of the interposer.

20. The electronic system of claim 17, wherein at least some of the high bandwidth memory devices each comprise a stack of multiple DRAM die.

21. A method of fabricating a microelectronic device assembly, the method comprising:
providing a wafer comprising multiple interposer locations, each interposer location of the wafer comprising cache memory within semiconductor material of the wafer;
mounting host devices on the wafer over and in operable communication with the cache memory of the interposer locations;
placing high bandwidth memory devices on one or more memory device locations of the interposer locations in operable communication with the host devices of the interposer locations; and
singulating the interposer locations to form interposers each having a host device and one or more high bandwidth memory devices thereon.

22. The method of claim 21, further comprising:
operably coupling a singulated interposer to a laminate substrate.

23. The method of claim 21, further comprising forming memory interface circuitry within each interposer location for communication with a memory device to be placed on each of the one or more memory device locations.

24. The method of claim 23, further comprising fabricating the cache memory within the semiconductor material of the wafer to comprise SRAM, wherein mounting a host device comprises mounting a GPU, a CPU or a SoC, wherein placing a high bandwidth memory device comprises stacking at least some DRAM die on the memory interface circuitry.

* * * * *

UNITED STATES PATENT AND TRADEMARK OFFICE
CERTIFICATE OF CORRECTION

| | | |
|---|---|---|
| PATENT NO. | : 11,476,241 B2 | |
| APPLICATION NO. | : 16/805341 | |
| DATED | : October 18, 2022 | |
| INVENTOR(S) | : Chan H. Yoo and Owen R. Fay | |

It is certified that error appears in the above-identified patent and that said Letters Patent is hereby corrected as shown below:

In the Specification

| | | |
|---|---|---|
| Column 3, | Line 20, | change "interposer" to --Interposer-- |
| Column 9, | Line 18, | change "(LBM)" to --(UBM)-- |
| Column 13, | Line 59, | change "4089" to --408B-- |
| Column 14, | Line 12, | change "foils" to --form-- |
| Column 14, | Line 27, | change "foils" to --form-- |

Signed and Sealed this
Tenth Day of January, 2023

Katherine Kelly Vidal
*Director of the United States Patent and Trademark Office*